(12) United States Patent  
Raynor

(10) Patent No.: US 9,100,605 B2  
(45) Date of Patent: Aug. 4, 2015

(54) GLOBAL SHUTTER WITH DUAL STORAGE

(75) Inventor: Jeffrey M. Raynor, Edinburgh (GB)

(73) Assignee: STMICROELECTRONICS (RESEARCH & DEVELOPMENT) LIMITED, Marlow Bucks (GB)

( * ) Notice: Subject to any disclaimer, the term of this patent is extended or adjusted under 35 U.S.C. 154(b) by 138 days.

(21) Appl. No.: 13/984,305

(22) PCT Filed: Feb. 7, 2012

(86) PCT No.: PCT/GB2012/050262
§ 371 (c)(1),
(2), (4) Date: Sep. 10, 2013

(87) PCT Pub. No.: WO2012/107750
PCT Pub. Date: Aug. 16, 2012

(65) Prior Publication Data
US 2014/0008520 A1    Jan. 9, 2014

(30) Foreign Application Priority Data
Feb. 9, 2011   (GB) .................... 1102247.2

(51) Int. Cl.
*H01L 27/00* (2006.01)
*H04N 3/14* (2006.01)
*H04N 5/378* (2011.01)
*H01L 27/146* (2006.01)

(52) U.S. Cl.
CPC .......... *H04N 5/378* (2013.01); *H01L 27/14612* (2013.01); *H01L 27/14683* (2013.01); *H01L 27/14689* (2013.01); *H01L 27/14643* (2013.01)

(58) Field of Classification Search
CPC .................................................. H01L 27/14612
USPC ....................................... 250/208.1; 348/308
See application file for complete search history.

(56) References Cited

U.S. PATENT DOCUMENTS

| | | | |
|---|---|---|---|
| 5,471,515 A | 11/1995 | Fossum et al. | |
| 7,286,174 B1 | 10/2007 | Weale et al. | |
| 7,697,051 B2 | 4/2010 | Krymski | |
| 7,772,536 B2 | 8/2010 | Yamada et al. | |
| 7,808,536 B2 | 10/2010 | Yamada et al. | |
| 2007/0285544 A1 | 12/2007 | Yamada et al. | |
| 2010/0013972 A1* | 1/2010 | Adkisson et al. | ............. 348/308 |

FOREIGN PATENT DOCUMENTS

| | | |
|---|---|---|
| EP | 2046022 | 4/2009 |
| EP | 2109306 | 10/2009 |
| WO | 00/05874 | 2/2000 |
| WO | 2006/073875 | 7/2006 |

* cited by examiner

Primary Examiner — Thanh Luu
(74) *Attorney, Agent, or Firm* — Allen, Dyer, Doppelt, Milbrath & Gilchrist, P.A.

(57) ABSTRACT

A sensor includes an array of pixels, and a global shutter configured to expose the array of pixels. Each pixel includes storage elements configured to independently store successive frames within a predetermined time period. Each storage element is configured to be independently read out.

30 Claims, 7 Drawing Sheets

GLOBAL SHUTTER WITH DUAL STORAGE

FIELD OF THE INVENTION

The present invention relates to improvements in or relating to sensors such as touch sensors for devices.

BACKGROUND OF THE INVENTION

Computer devices, such as laptops and the like, are often equipped with touch sensitive sensors or navigation devices. These are typically CMOS devices which include an array of pixels acting as an image sensor. The image sensor detects movement of an object in the vicinity thereof and converts that detected movement into control signals for controlling the computer device.

Some CMOS image sensors include a rolling blade shutter in which the pixels are processed line by line, one being integrated and another being read out for each movement of the shutter. The shutter moves over the array so that the pixels are exposed for the same amount of time, but not all at the same time. Rolling blade shutter does not work well when taking images of fast moving objects as is illustrated by the imaging problems associated with fans, helicopter blades or propellers. Operating a rolling blade shutter for most types of consumer use is not generally a problem and in fact most users do not notice these types of artefact.

However, in the area of machine vision where the images are processed and analyzed by a computer algorithm, distortion of an image due to motion can be a major drawback. In these cases the algorithms will typically fail or produce inaccurate or unreliable data. As a result, in machine vision types of application, a pixel array with global shutter is generally used. Here, pixels are simultaneously released from reset and start to integrate simultaneously. After a specific period, the pixels are then read out simultaneously into a temporary storage, which is often located inside the pixel. This temporary storage is then scanned out row by row where the signal is amplified or converted into a digital value.

Pixels for rolling blade shutter operation typically have a low number of transistors and so are less dense and suitable for sensors with large number of pixels where the size of the die and the size of the image plane should be kept small.

Currently, global shutter pixels have a single storage element in each pixel. Hence after an image has been acquired, it is to be read out before the next signal can be acquired. This typically involves an amplification process and/or a conversion into a digital value. The readout time is typically significantly longer than the exposure time. For example, a 640×480 pixel array can be read out at 200 Hz (5 ms) while the exposure time could be as short as 10 µs to prevent or reduce motion blur. Hence, with a single storage element in each pixel, two exposures could be as much as 5 ms apart.

The type of delay caused by readout of the array can cause issues in certain circumstances. For example, if background or ambient illumination is to be removed from an image, the amount of ambient illumination (e.g. due to flicker from mains-powered lamps) could change considerably in 5 ms. Similarly, if motion detection is desired, then the image may have moved considerably in 5 ms, making it harder to determine the direction of movement, and potentially making the system sensitive to temporal aliasing. Temporal aliasing occurs if a structure with a repetitive spatial frequency such as a barcode or propeller blade has moved almost one complete cycle during the delay between frames, at which point the second image will appear to have moved backwards.

To avoid these types of issues, it is desirable to be able to take two images in very quick succession especially for ambient light detection and movement detection.

U.S. Pat. No. 7,375,752 discloses a global shutter implementation suitable for small image array sizes (e.g. 20×20 pixels) in an optical mouse suitable for storage of multiple images per pixel. However, as there are as many interconnection wires between the array and the readout as there are pixels in the array this technique would not work with larger arrays, as the wires would block light from falling onto the array.

Various circuit architectures have been proposed to attempt to develop a global shutter application which can be used to store one image or a number of subsequent images.

A three transistor (3T) pixel architecture has been proposed which provides gain within the pixel and so has low noise. It can also be fabricated in most CMOS process technology without any modification to the process. However the architecture suffers from issues associated with dark current and reset (kTC) noise.

A four transistor (4T) pixel architecture is proposed having a buried photodiode so that the architecture is immune to dark current generated at the surface and hence has a lower dark current than the photodiode on a 3T pixel. The pixel is engineered so that it can be fully depleted and as such there are no electrons stored on it during reset and so is immune to kTC noise. This architecture is adopted for systems with small pixel size and where the system is to operate in low light levels as it has lower noise than a 3T pixel architecture.

The 4T pixel architecture does not work well under high light levels as once the charge on the photodiode has decayed to ground, further photo-generated charge will not be stored in the photodiode but can flow to adjacent pixels, degrading the image in a process called "blooming".

A five pixel architecture (5T) has been proposed which addresses the issues of blooming under high light levels by using another transistor to provide a path for photo-generated electrons when the pixel is not integrating. However, the 5T architecture has a single storage node and so cannot acquire two frames quickly. In addition, the voltage stored on the sense node is affected by dark current or parasitic light sensitivity. Typically the capacitance of the sense node is kept low to increase the conversion gain and hence a small level of dark current or photo-generated charge will have a large effect.

A seven pixel (7T) architecture has been proposed which overcomes the issue with parasitic light sensitivity and dark current by having a source follower in the pixel and storing the signal on a larger capacitor. However, this pixel is not suitable for rapid acquisition of images as the image still needs to be read out from the array before the next one is acquired.

X. Wang, J. Bogaerts, et. al. have proposed an eight pixel (8T) architecture in SPIE Electronic Imaging 2010 vol. 7536: "A 2.2 µm CIS for machine vision applications". This pixel has 3 storage nodes in the form of a floating diffusion and two capacitors. The second capacitor allows for greater suppression of parasitic light sensitivity but does not allow for speedier image acquisition.

A photo-gate pixel is disclosed in U.S. Pat. No. 5,471,515 and is similar to the widely used 4T pixel, except that it uses a photo-gate in which a potential voltage is applied to form a "potential well" so that photo-generated charge can be accumulated. This has a lower dark current than the 3T pixels but is no longer used as the reset (aka "kTC") noise cannot be cancelled and the photo-gate reduces the sensitivity of the pixel to light, especially in the blue region of the spectrum.

Although the photo-gate pixel is capable of global shutter operation, it has only 1 storage capacitor and thus also suffers from blooming.

The photo-gate pixel can be adapted to have two readout channels and could be used to acquire two images with very short (<10 μs) interval as described in U.S. Pat. No. 6,838, 653. However it is difficult to manufacture this architecture as the photo-gate is typically overlapped by the two transfer gates to ensure photo-generated charge is transferred efficiently. This overlapping of polysilicon is not common in either standard CMOS or imaging process technologies and is difficult to produce. Further, pixels are particularly sensitive to parasitic light sensitivity and blooming as there is no way to reset the photo-gate without also resetting the floating diffusion capacitor where the signal is stored. If the photo-generated charge from one image is not completely transferred on read of the image then the charge will be transferred on the next image causing temporal noise in the next image.

As a result, there is no satisfactory design providing a sensor having a global shutter arrangement and having fast capture of two images for the purposes of ambient light sensing and/or movement detection.

SUMMARY OF THE INVENTION

According to one aspect of the present invention there is a sensor having an array of pixels, wherein the sensor includes a global shutter and each pixel includes at least two storage elements adapted to independently store two or more successive frames within a predetermined time period. Each storage element is adapted to be independently read out.

Optionally, the storage elements are adapted to be read out simultaneously. Optionally, the storage elements are adapted to be read out by means of a bit line. Optionally, there are two bit lines. Optionally, the storage elements comprise transistors. Optionally, the storage elements comprise capacitors.

Optionally, the two or more successive frames are processed to determine ambient light conditions. Optionally, the two or more successive frames are processed to determine movement of an object from one from one frame to a successive frame. Optionally, the movement of the object is used to generate a control signal for the device. Optionally, the screen is a touch screen.

The present invention offers a number of benefits. The present invention produces a pixel which is suitable for global shutter operation, relatively insensitive to parasitic light sensitivity, does not suffer from blooming and is able to acquire two images in quick succession (e.g. <10 μs). The pixels can be used in a sensor for any type of application and are particularly advantages for ambient light sensing and movement detection. An array of such pixels is capable of being used in machine vision and other similar applications.

BRIEF DESCRIPTION OF THE DRAWINGS

Reference will now be made, by way of example, to the accompanying drawings, in which.

DETAILED DESCRIPTION OF THE PREFERRED EMBODIMENTS

The present invention relates to a global shutter system which has a 7T pixel architecture and has at least two storage nodes. A global shutter can expose the whole pixel array simultaneously so that the pixels are illuminated and charge stored during the exposure time of the shutter. Thereafter the pixels are read in any manner that suits the circumstances. The exposure time and operation of the shutter occurs by controlling the timing of the pixels. The pixels are adapted to store charge during a specific time period which corresponds to the shutter speed of the global shutter. As the floating diffusion capacitor and photodiode can be reset independently from the image storage nodes, the pixel does not suffer from blooming as both of these nodes can be reset when the sensor is not being exposed and not affect the storage action required for the global shutter. From the formula $I=C*dV/dt$ (where I is the current, C the capacitance, dV change in voltage and dt the change in time) it can be seen that if I is constant (e.g. same amount of dark current or photo-generated charge) and the same readout time (dt) then the change in voltage (dV) will be reduced if the capacitance C is increased. Hence the capacitance of the storage nodes can be made sufficiently large so that dark current and current from parasitic light has a relatively insignificant effect on pixel operation.

Figure 1:
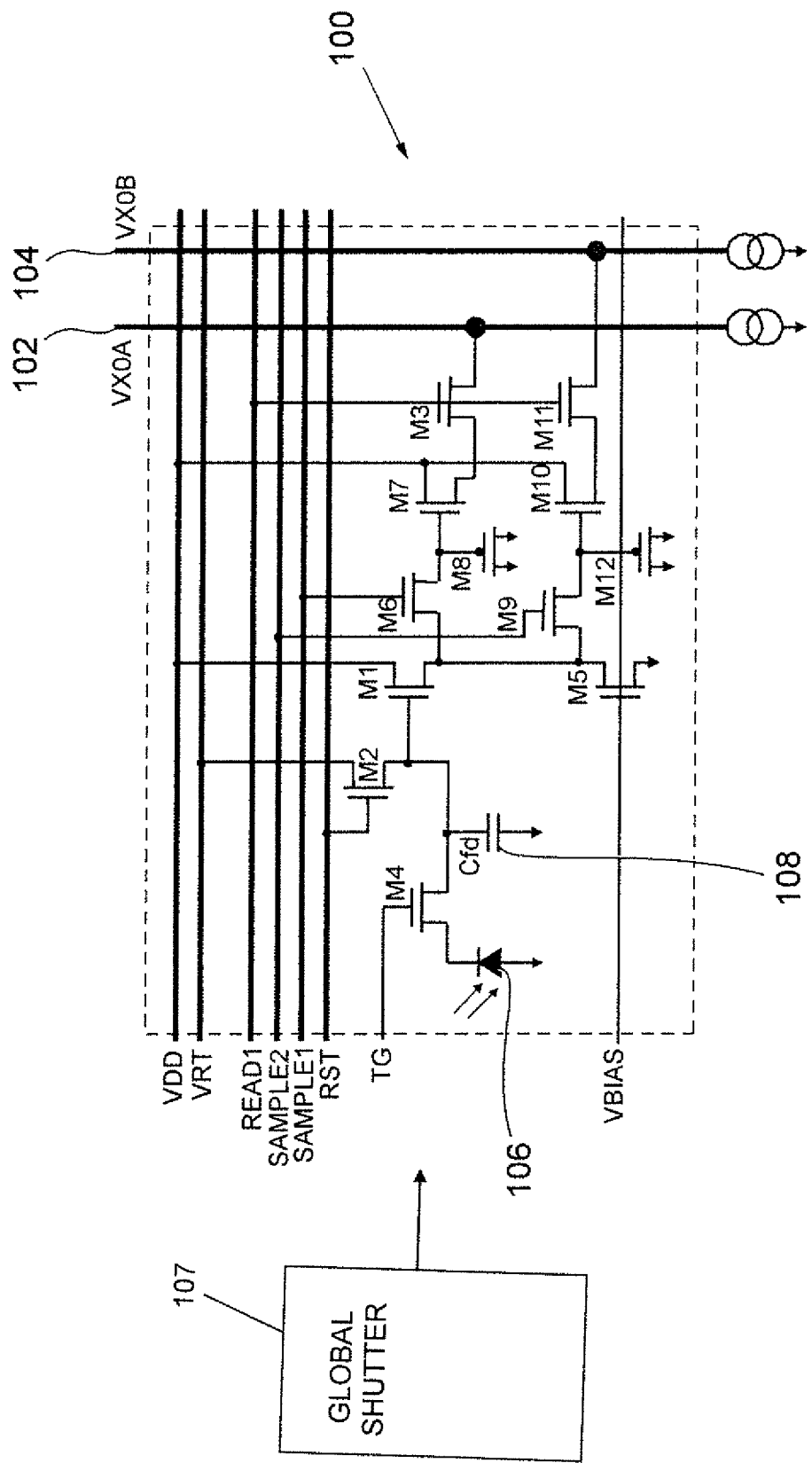
FIG. 1 is a circuit diagram of a ten transistor pixel architecture circuit, in accordance with an embodiment of the present invention.

Referring to FIG. 1, a first embodiment of the invention will now be described. This is a 10T pixel with two output bit lines. The circuit 100 includes a number of transistors M1 to M12, the functions of which will be set out in more detail below, and a global shutter 107 which can expose the whole pixel array simultaneously. It should be noted that the transistors M8 and M12 are storage devices and may be replaced by simple capacitors or any other appropriate device. The circuit also includes two output bit lines 102 and 104; a photodiode 106 and a floating diffusion capacitor 108. The circuit includes input and output lines (VDD, VRT, TG, VBIAS, READ1, SAMPLE1, SAMPLE2 and RESET).

M1 is a source-follower where the voltage on the source of M1 follows the voltage on the gate of M1. M2 is used to reset the floating diffusion capacitor 108 and if TG is high, the photodiode will also be reset. M3 is a read transistor and is enabled when the signal from the corresponding row is required. It is disabled when another row in the sensor is being accessed.

M4 is a transfer gate transistor to transfer charge during pixel reset from VRT to the photodiode and during pixel readout from the photodiode to the floating diffusion node. M5 is an active load for M1 to help ensure it operates correctly. To save power, it is possible to pull VBIAS low when the pixels are not being read out so that M1 is not used. Transistor M6 is used as a switch and when enabled, allows the voltage at the source of M1 to be stored on the capacitor M8. M8 is a capacitor where the signal from the pixel is stored. M8 can be a metal-metal capacitor, but as the capacitor is storing a voltage and not a charge and is followed by a source-follower transistor (M7), it does not need to be linear and hence the gate of a MOS transistor can be used as the capacitor. M7 is a source follower for the voltage on the storage node M8.

M9 provides the same functionality as M6, but for a second storage site. M10 provides the same functionality as M7, but for the second storage site. M11 provides the same functionality as M3, but for the second storage site. M12 provides the same functionality as M8, but for the second storage site.

In the prior art there are architectures which include two capacitors or storage devices. The control of storage to, or read out from, the capacitors does not enable two separate images to be handled separately. In addition, there is an effect from the first storage device on the second storage device (and vice versa) when storing and reading due to charge sharing and the like.

The present invention overcomes these issues by writing to and reading from each storage element independently. The two storage elements M8 and M12 are each written to respectively at first and second times, which times correspond to the successive frames captured.

Figure 2:
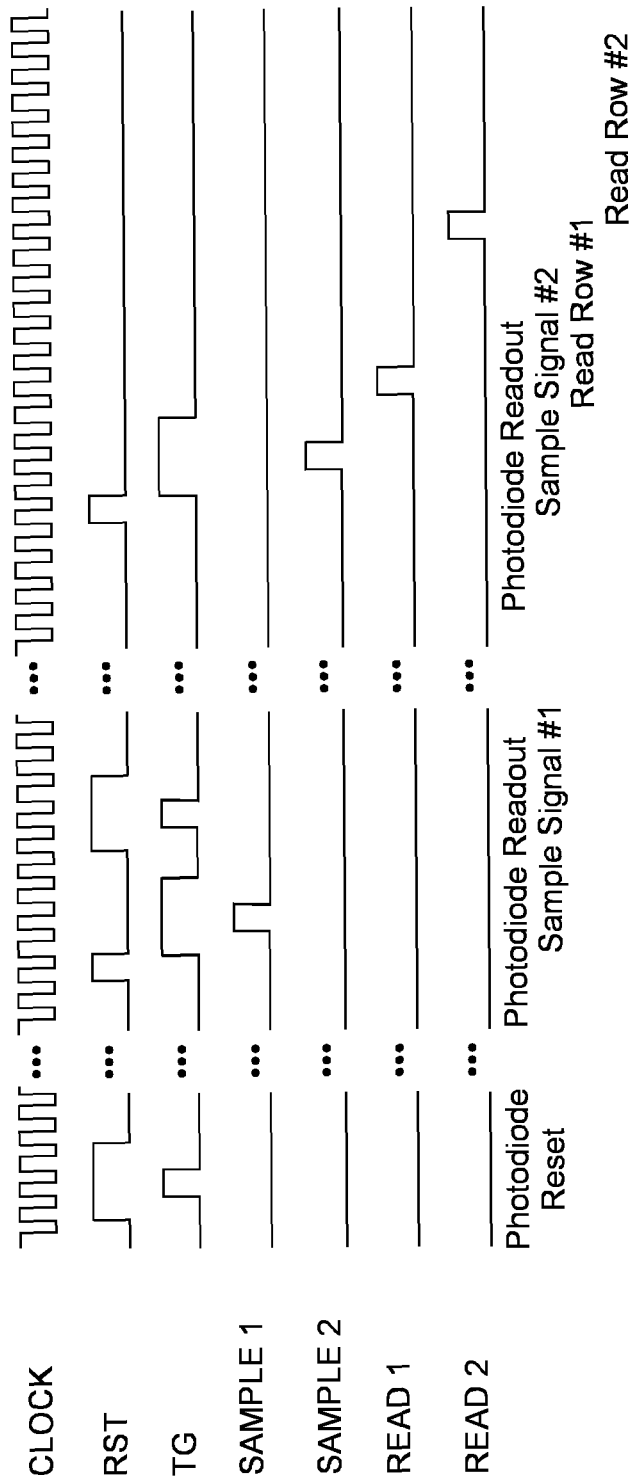
FIG. 2, is a timing diagram of the FIG. 1 architecture, in accordance with an embodiment of the present invention.

The typical operation of the FIG. 1 pixel can be seen in FIG. 2. This sequence captures two images and then reads the images out. The two images may be one with ambient and LED illumination and one with only ambient illumination, or may be two subsequent images for the purposes of motion detection.

The first operation is to reset the photodiode. This is done by pulsing TG (transfer gate) high while the RESET is high. The system then waits an appropriate period of time (variously called exposure time, integration time or shutter time) and then the signal on the photodiode is sampled and voltage corresponding to the intensity of the signal is stored. This is accomplished by first resetting the floating diffusion node 108 in FIG. 1 by pulsing RESET with TG low. The photo-generated charge from the photodiode is transferred to the floating diffusion by pulsing TG and this charge is converted to a voltage by the capacitance of the floating diffusion capacitor 108. The voltage is buffered by the source follower M1. The signal is stored on the first sampling capacitor (M8) by enabling the switch transistor M6 by pulsing SAMPLE1 high.

At this point in time, the signal from the first frame has been stored and the photodiode is reset again. The system then waits an appropriate period of time and the second frame and the photo-generated charge is then read out in a similar manner, except that this time the signal is stored on the second sampling capacitor (M12) by enabling the switch transistor M9 with a high logic level pulse SAMPLE2.

Two images have now been independently acquired and stored in all the pixels in the array. Each of the two images may then be read out independently and optionally converted to a digital signal. Typically this is done row by row by pulsing high the READ signal of each row of the array sequentially.

The above description is typical for a 4T pixel. However, for a 3T pixel there is no transfer gate or separate floating diffusion node, so the TG pulses would not be present and there would be no need to reset the floating diffusion node.

Having two output bit lines from the pixel is the fastest way to independently readout the array as both storage sites in the pixel are available simultaneously. It also permits analog operation on the signal, such as for example, differencing of the signals. The system includes two metal conductors which may reduce the fill-factor of the pixel and hence its responsivity.

Figure 3:
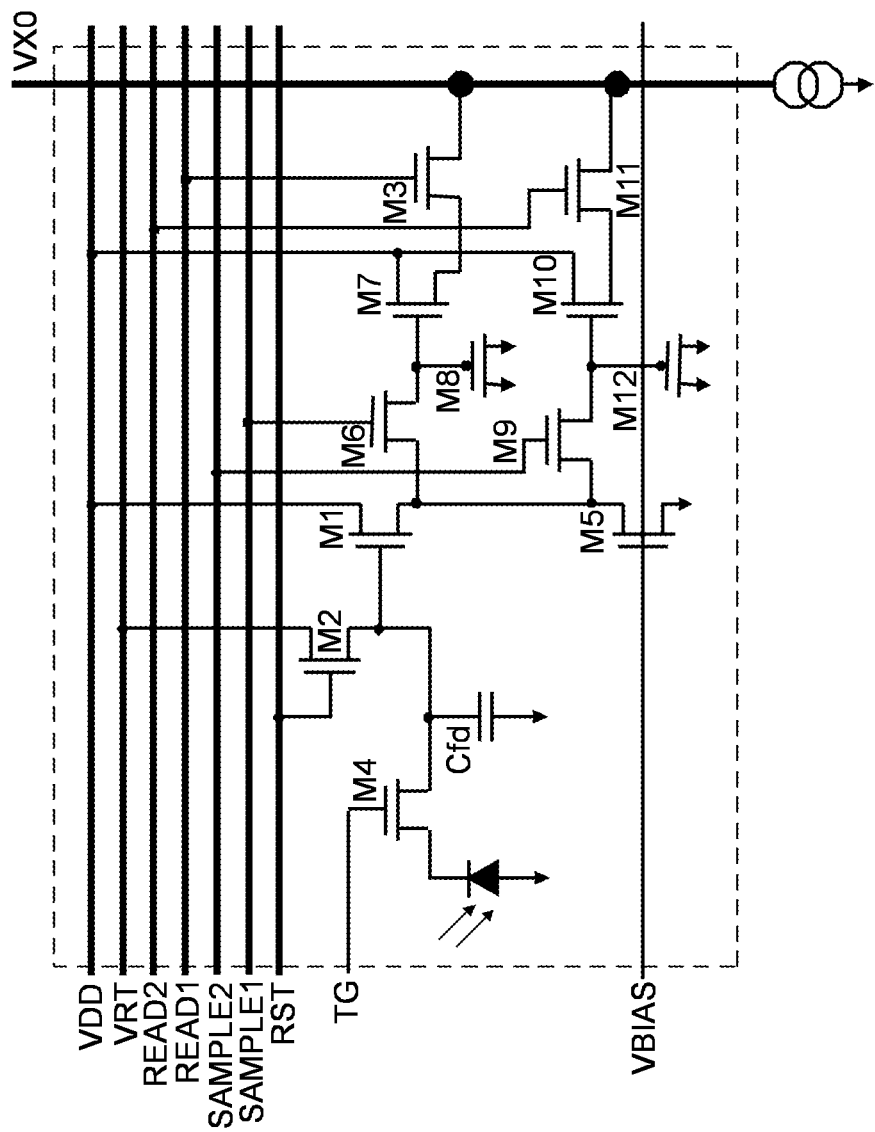
FIG. 3 is a circuit diagram of a ten pixel architecture circuit, in accordance with an embodiment of the present invention.

FIG. 3 shows a second embodiment which is a 10T pixel with a single bit line and dual output source followers. This implementation will reduce the amount of metal wiring that is required vertically from row to row. As a consequence there is a reduction in bandwidth and the addition of a horizontal metal conductor (from column to column) this is referred to as "READ2".

The operation of a source-follower does not copy exactly the same voltage from the input to the output. For example, there is a voltage difference between these two signals due to the threshold voltage of the transistor. The threshold voltage is determined by the doping and thickness of the gate oxide insulator layer. This is typically very thin of the order of between about 3 nm and 6 nm. As a result the threshold voltage is susceptible to small variations during manufacture and will vary from one transistor to the next.

In the circuits shown in FIG. 1 and FIG. 3, the input source follower (M1) is common to both paths and so when the signals, which are stored on each of the two storage elements (M8, M12), are subtracted from one another, the pixel-pixel variation in M1 will be cancelled. However the output source follower transistors (M7, M10) are not common and so their differences will not be cancelled without a suitable operation being applied. This cancellation can be performed by resetting the floating diffusion and storing the reset voltage in the storage elements M8 and M12 and then performing a readout followed by a subtraction operation. This technique uses two readout operations and so the readout time is doubled and readout rate is halved. Nevertheless, both the storage and read out of each storage element occurs independently from the other.

Figure 4:
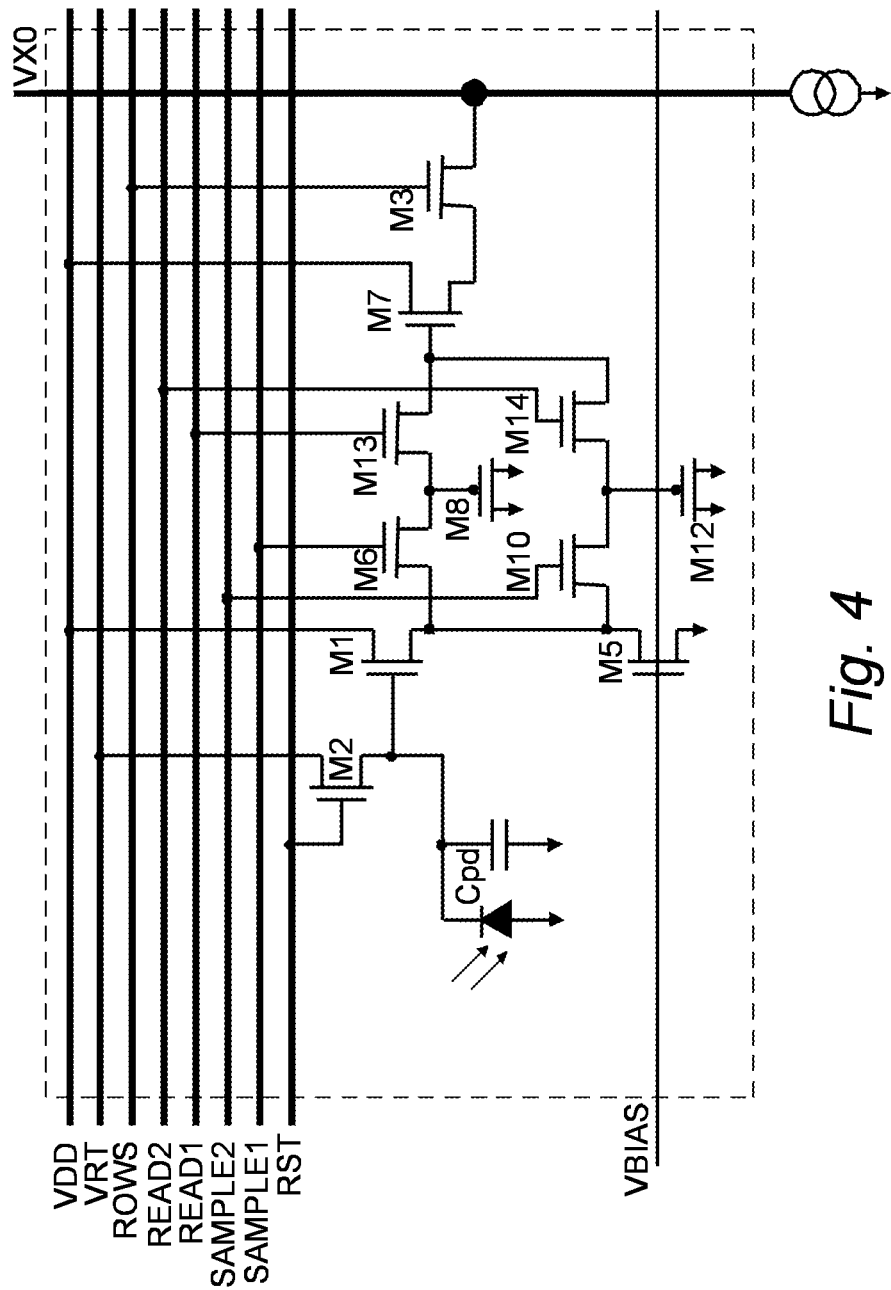
FIG. 4 is a circuit diagram of a ten pixel architecture circuit, in accordance with an embodiment of the present invention.

FIG. 4 shows a further embodiment which is a 10T pixel architecture with a single bit line and a single output source follower transistor. As the source follower transistors M1 and M9 are common to both storage elements, any pixel-pixel variation in the threshold voltage will be cancelled when the signals from the two storage elements are subtracted.

As there is a single bit line, it is useful to perform two independent read operations for this pixel and so the readout rate will be less than that of the arrangement in FIG. 1. However, the reduction in speed will be less than 2 times, since a significant part of the readout cycle involves analogue to digital conversion. As such it is practical to readout the signal from one storage element in the pixel, store it in the column (on a large capacitor to reduce errors) and then readout the signal from the other storage element and perform a subtraction using analogue circuitry before it is converted to the digital domain. Again, the storage and read operation of each storage elements occurs independently from that of the other.

Alternatively, it may be possible (depending on size of the pixel and size of the ADC) to have two external ADCs per column, to store each signal on a different capacitor and then convert both signals simultaneously.

Figure 5:
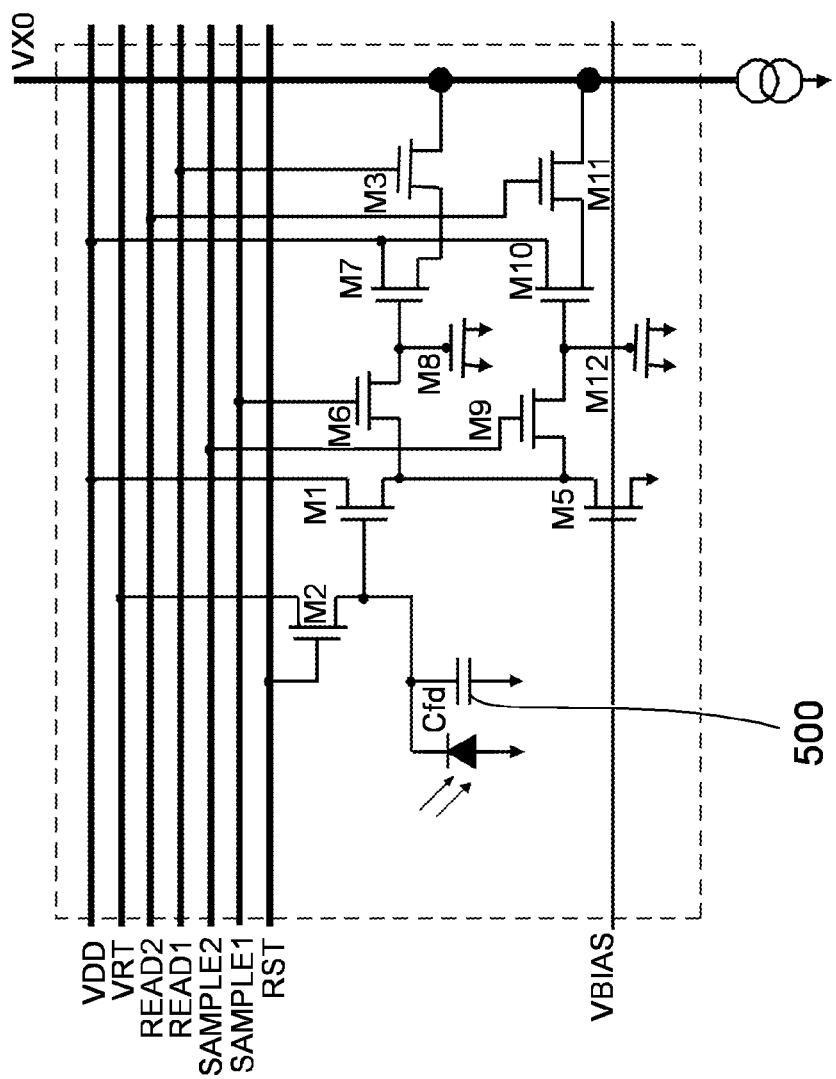
FIG. 5 is a circuit diagram of a three pixel architecture circuit with dual storage, in accordance with an embodiment of the present invention.
Figure 6:
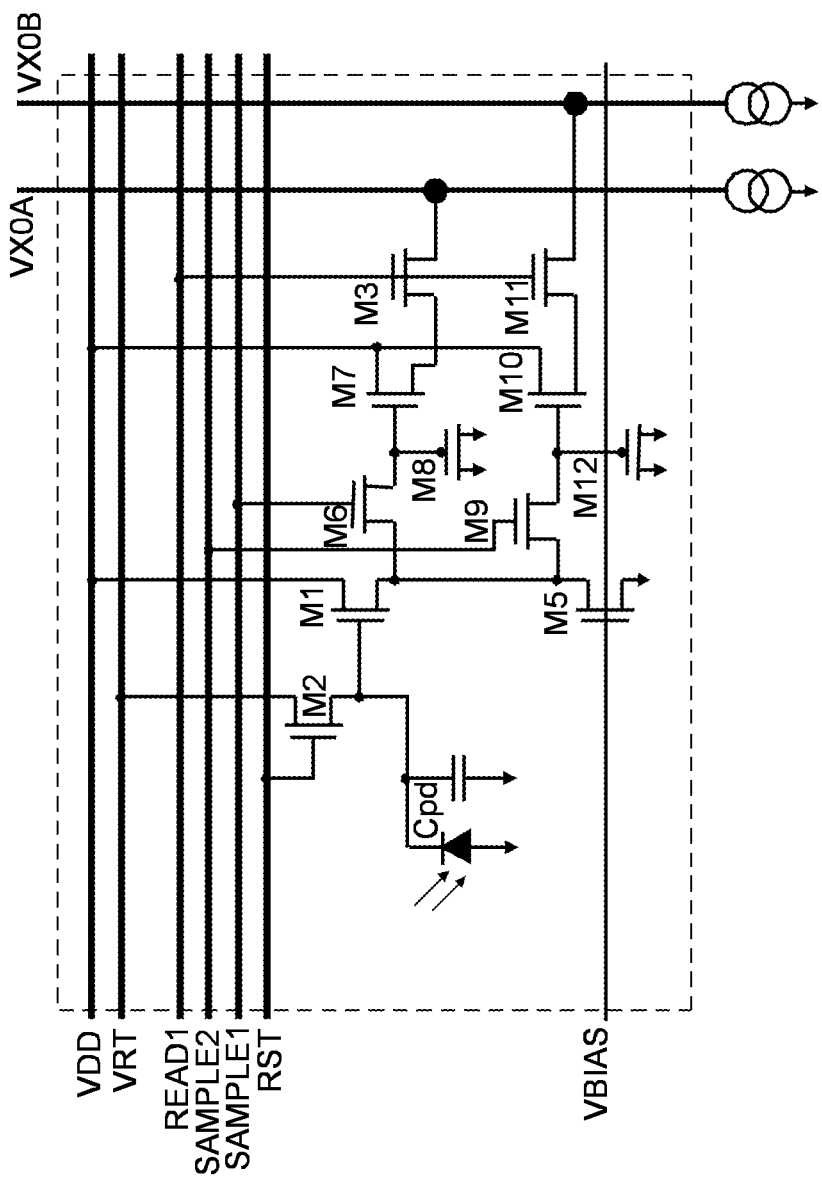
FIG. 6 is a circuit diagram of a three pixel architecture circuit with dual storage, in accordance with an embodiment of the present invention.
Figure 7:
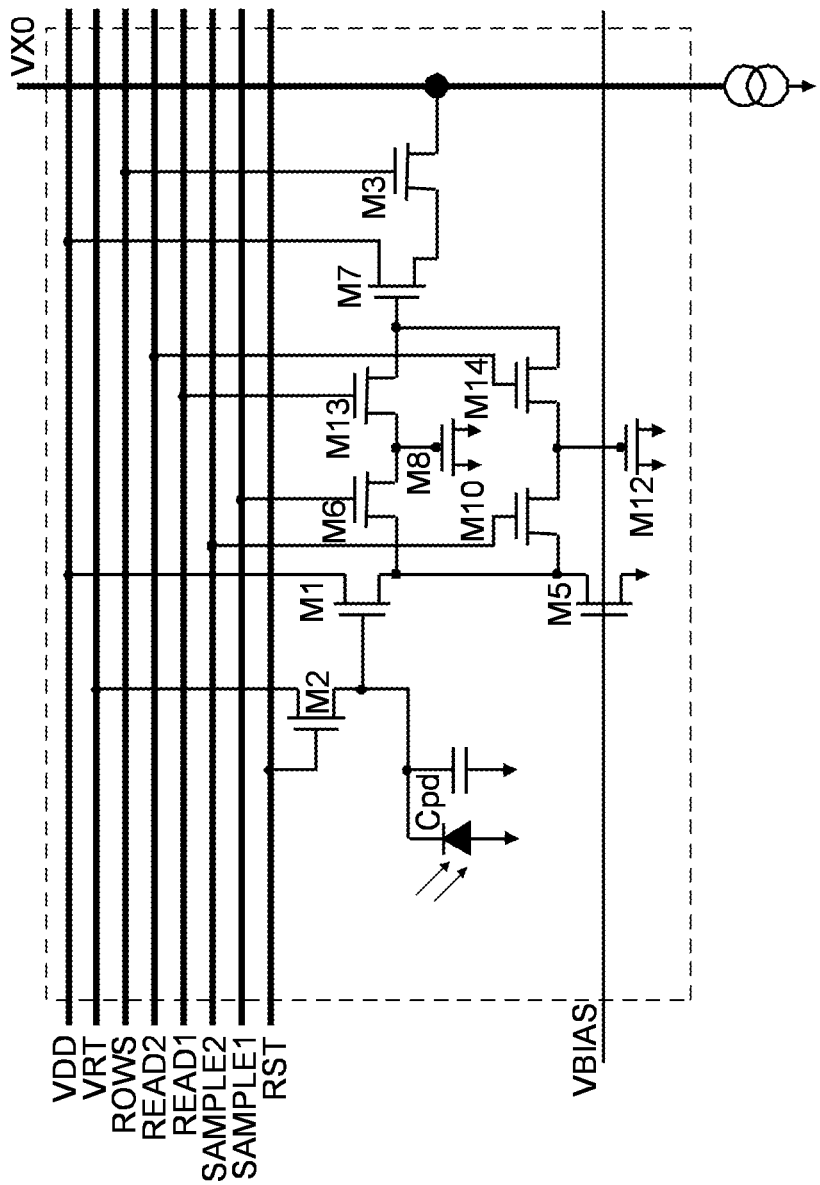
FIG. 7 is a circuit diagram of a three pixel architecture circuit with dual storage, in accordance with an embodiment of the present invention.

As previously mentioned the embodiments shown in FIGS. 1, 3 and 4, all use a modification of the 4T architecture. Although this architecture is advantageous as it reduces dark current and reset noise, it is still possible to use the invention with a 3T type of pixel architecture. Examples of these embodiments are shown in FIGS. 5, 6 and 7. The transfer gate "M4" and "Cfd" have been removed and the capacitance "Cpd" 500 is the combination of the capacitance of the photodiode and other parasitic capacitances at the gate of transistor M1. This capacitance sets the pixels conversion gain which is the voltage output swing for each photo-generated electron. In each embodiment the storage to and reading from the storage elements occurs independently one from the other.

In FIGS. 1, 3, 4, 5, 6, and 7 the photodiode source follower (M1) and output source follower (M7 and where present M9) are the same type, such as an NMOS device. This type of device is the most efficient for keeping the size of the pixel small or for accommodating an increase in the size of the photodiode, as both transistors can be in the same well, such as a P-Well. There is a voltage drop ("VT") across each of these transistors and so the output of the pixel, on the bit line VX0, is (2×VT) lower than the voltage on the photodiode. This can reduce the practical voltage swing on the pixel and so reduce the dynamic range of the system.

An alternative way of implementing the invention is to use voltage followers of opposite polarity. The most practical is to keep the photodiode source-follower M1 as an NMOS and make the output source followers M7 and M10 the opposite polarity, a PMOS, as the voltage drops ("VT") are of opposite polarity but similar magnitude. As a result, instead of having a (2×VT) voltage drop between the photodiode and output bit line, the voltage drop is approximately 0. It is unlikely that the voltage drop will be exactly 0 as the thresholds of the NMOS and PMOS transistors will not be exactly the same, for example, 300 mV and −350 mV respectively.

Each of the pixel architectures above can be combined in an array of pixels to act as a sensor. The number of pixels in the array will depend on nature and size of the sensor. The sensor will include appropriate optics for directing light to the sensor and appropriate circuitry for measuring, processing and using the generated signal. The output from each pixel will be read in a particular manner in order to output the required image. For example, the pixels could be read sequentially row by row to output the image.

The above described embodiments enable motion detection or ambient light cancellation in a global shutter pixel system. The embodiments described above each allow at least two images to be taken independently in quick succession and read out independently in an acceptable time frame to enable ambient light measures to be calculated from the successive images. In addition, in a motion detector environment, the successive images are close enough in time for meaningful movements to be measured and then converted into control functions and the like. The above embodiments deal with capturing and processing two sequential images. By addition of appropriate circuitry the pixels could be adapted to capture more than two images, if desired.

The pixels, or pixel array or sensor are intended for use in any appropriate device such as a touch screen, or any machine vision application or other optical input device such as a mouse or finger mouse. However, it will be appreciated that the sensor could be used in any appropriate device, for example fingerprint reader or Lab-on-chip/Bio-Optical sensor systems (which detect chemi-fluorescence for medical and/or bio-testing applications).

The sensor may be used in any suitable device such as a mobile or smart telephone, other personal or communications devices, a computer, a remote controller, access modules for doors and the like, a camera or any other suitable device.

There are many variations of the present invention which will be appreciated by the person skilled in the art and which are included within the scope of the present invention.

The invention claimed is:

1. A sensor comprising:
an array of pixels, with each pixel comprising
a photodiode,
a floating diffusion capacitor coupled to a floating diffusion node,
a transfer gate transistor coupled between said photodiode and said floating diffusion capacitor and configured to transfer a charge to said photodiode during pixel reset and during pixel readout from said photodiode to the floating diffusion node, and
a plurality of storage elements coupled to the floating diffusion node and configured to independently store a plurality of successive frames within a predetermined time period, and with each storage element being configured to be independently read out; and
a global shutter configured to expose the array of pixels.

2. The sensor of claim 1, wherein the storage elements are configured to be read out simultaneously.

3. The sensor of claim 1, further comprising a single bit line configured to read out the storage elements.

4. The sensor of claim 1, further comprising a plurality of bit lines, each storage element being configured to be read out via a different bit line.

5. The sensor of claim 4, wherein the plurality of bit lines comprises two bit lines, and wherein the plurality of storage elements comprises two storage elements.

6. The sensor of claim 1, wherein each storage element comprises at least one transistor.

7. The sensor of claim 1, wherein each storage elements comprises at least one capacitor.

8. The sensor of claim 1, further comprising processing circuitry coupled to the plurality of storage elements and configured to process a plurality of successive frames so as to determine ambient light conditions.

9. The sensor of claim 1, further comprising processing circuitry coupled to the plurality of storage elements and configured to process a plurality of successive frames so as to determine movement of an object from one frame to a successive frame.

10. The sensor of claim 9, wherein the processing circuitry generates a control signal based on movement of the object.

11. An electronic device comprising:
a sensor comprising
an array of pixels, each pixel comprising
a photodiode,
a floating diffusion capacitor coupled to a floating diffusion node,
a transfer gate transistor coupled between said photodiode and said floating diffusion capacitor and configured to transfer a charge to said photodiode during pixel reset and during pixel readout from said photodiode to the floating diffusion node, and
a plurality of storage elements configured to independently store a plurality of successive frames, each storage element being configured to be independently read out, and
a global shutter configured to expose the array of pixels.

12. The electronic device of claim 11, wherein the electronic device is configured to define a machine vision device.

13. The electronic device of claim 11, wherein the electronic device is configured to define a computer.

14. The electronic device of claim 11, wherein the electronic device is configured to define a phone.

15. The electronic device of claim 11, wherein the electronic device is configured to define a camera.

16. The electronic device of claim 11, wherein the electronic device is configured to define a touch screen.

17. The electronic device of claim 11, wherein the electronic device is configured to define a remote controller.

18. An image capture method comprising:
simultaneously exposing each pixel in an array of pixels, with each pixel comprising a photodiode, a floating diffusion capacitor coupled to a floating diffusion node, a transfer gate transistor coupled between the photodiode and the floating diffusion capacitor and configured to transfer a charge to the photodiode during pixel reset and during pixel readout from the photodiode to the floating diffusion node, and a plurality of storage elements coupled to the floating diffusion node;

independently storing within the plurality of storage elements of each pixel a plurality of successive frames within a predetermined time period such that the plurality of successive frames are stored simultaneously in the plurality of storage elements within each pixel; and independently reading out each of the successive frames from the plurality of storage elements in each pixel.

19. The image capture method of claim 18, wherein the simultaneously stored successive frames are read out simultaneously.

20. The image capture method of claim 18, wherein the plurality of successive frames are read out via a single bit line.

21. The image capture method of claim 18, wherein each of the simultaneously stored plurality of successive frames are read out via dedicated bit lines.

22. The image capture method of claim 21, wherein two successive frames are stored within each pixel.

23. The image capture method of claim 18, wherein the plurality of successive frames are processed to determine ambient light conditions.

24. The image capture method of claim 18, wherein the plurality of successive frames are processed to determine movement of an object from one frame to a successive frame.

25. The image capture method of claim 24, wherein the movement of the object is used to generate a control signal for the device.

26. A method of making a sensor comprising:
forming an array of pixels, with each pixel of the array comprising
a photodiode,
a floating diffusion capacitor coupled to a floating diffusion node,
a transfer gate transistor coupled between said photodiode and said floating diffusion capacitor and configured to transfer a charge to said photodiode during pixel reset and during pixel readout from said photodiode to the floating diffusion node, and
a plurality of storage elements coupled to the floating diffusion node and configured to independently store a plurality of successive frames, with each storage element being configured to be independently read out; and
configuring a global shutter to expose the array of pixels.

27. The method of claim 26, wherein the storage elements are configured to be read out simultaneously.

28. The method of claim 26, further comprising configuring at least one bit line to read out the storage elements.

29. The method of claim 26, further comprising configuring processing circuitry coupled to the plurality of storage elements to process a plurality of successive frames to determine ambient light conditions.

30. The method of claim 26, further comprising configuring processing circuitry coupled to the plurality of storage elements to determine movement of an object from one frame to another frame.

* * * * *